United States Patent
Adusumilli et al.

(10) Patent No.: US 10,008,507 B2
(45) Date of Patent: Jun. 26, 2018

(54) METAL FINFET ANTI-FUSE

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Miaomiao Wang, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/099,199

(22) Filed: Apr. 14, 2016

(65) Prior Publication Data
US 2017/0301680 A1    Oct. 19, 2017

(51) Int. Cl.
*H01L 29/04* (2006.01)
*H01L 27/112* (2006.01)
*H01L 29/66* (2006.01)

(52) U.S. Cl.
CPC .. *H01L 27/11206* (2013.01); *H01L 29/66545* (2013.01)

(58) Field of Classification Search
CPC ................ H01L 23/5252; H01L 23/58; H01L 27/11206; H01L 29/66545
USPC .................. 257/50, 530; 438/131, 467, 600
See application file for complete search history.

(56) References Cited

U.S. PATENT DOCUMENTS

| | | | |
|---|---|---|---|
| 6,396,120 B1 * | 5/2002 | Bertin | H01L 29/42384 257/530 |
| 7,087,499 B2 | 8/2006 | Rankin et al. | |
| 8,848,423 B2 | 9/2014 | Chung | |
| 9,159,734 B2 | 10/2015 | Hafez et al. | |
| 9,165,936 B2 | 10/2015 | Booth, Jr. et al. | |
| 9,633,943 B2 * | 4/2017 | Cheng | H01L 23/5252 |
| 2009/0108400 A1 * | 4/2009 | Cestero | H01L 23/5252 257/530 |
| 2011/0031582 A1 | 2/2011 | Ponoth et al. | |
| 2014/0015095 A1 | 1/2014 | Hui et al. | |
| 2014/0179070 A1 | 6/2014 | Yang | |
| 2014/0346603 A1 | 11/2014 | Toh et al. | |

OTHER PUBLICATIONS

Y. Liu et al., "Anti-fuse memory array embedded in 14nm FinFET CMOS with novel selector-less bit-cell featuring self-rectifying characteristics" Symposium on VLSI Technology, Jun. 9-12, 2014, 2 pages.
P. C. Peng et al., "High-Density FinFET One-Time Programmable Memory Cell With Intra-Fin-Cell-Isolation Technology," IEEE Electron Device Letters, Oct. 2015, vol. 36, No. 10, pp. 1037-1039.

* cited by examiner

*Primary Examiner* — Brook Kebede
(74) *Attorney, Agent, or Firm* — Scully, Scott, Murphy & Presser, P.C.; Daniel P. Morris, Esq.

(57) ABSTRACT

Semiconductor structures containing FinFET anti-fuses with reduced breakdown voltage are provided which can be readily integrated with high performance FinFETs. The anti-fuse includes at least one metal structure having a faceted sidewall. The sharp corner of the faceted sidewall of the at least one metal structure causes an electric field concentration, thus reducing the breakdown voltage of the anti-fuse.

12 Claims, 14 Drawing Sheets

METAL FINFET ANTI-FUSE

BACKGROUND

The present application relates to semiconductor technology. More particularly, the present application relates to semiconductor structures containing FinFET anti-fuses with reduced breakdown voltage which can be readily integrated with high performance FinFETs. The present application also relates to methods of forming such semiconductor structures.

An anti-fuse is an electrical device that performs the opposite function to a fuse. Whereas a fuse starts with a low resistance and is designed to permanently break an electrically conductive path (typically when the current through the path exceeds a specified limit), an anti-fuse starts with a high resistance and is designed to permanently create an electrically conductive path (typically when the voltage across the anti-fuse exceeds a certain level).

Programmable on-chip anti-fuses are needed in many circuit applications. In some applications, it preferable to fabricate on-chip anti-fuses during FinFET CMOS fabrication in order to minimize process cost and improve system integration. Using the same dielectric material as the gate dielectric and the anti-fuse dielectric will simplify process complexity. The breakdown voltage of conventional planar anti-fuses with a gate dielectric is too high. Also, planar anti-fuses use too much area compatible with current ground rules of 10 nm or 7 nm technology. Therefore, there is a need for improved on-chip FinFET compatible anti-fuses.

SUMMARY

In one aspect of the present application, semiconductor structures are provided. In one embodiment of the present application, the semiconductor structure includes an anti-fuse located on a substrate, wherein the anti-fuse includes at least one metal structure having a faceted sidewall. The term "faceted sidewall" denotes a sidewall of a material that has at least one sharp corner. Thus, the faceted sidewall of the at least one metal structure is not perpendicular to the underlying topmost horizontal surface of a substrate. The sharp corner of the faceted sidewall of the at least one metal structure causes an electric field concentration, thus reducing the breakdown voltage of the anti-fuse.

In another aspect of the present application, methods of forming a semiconductor structure are provided. In one embodiment of the present application, the method may include forming a sacrificial gate structure straddling over a portion of a semiconductor fin. Next, a planarized dielectric material is formed having a topmost surface that is coplanar with a topmost surface of the sacrificial gate structure and on each side of the sacrificial gate structure. The sacrificial gate structure is thereafter removed to provide a cavity. The cavity is extended entirely though the semiconductor fin to provide a source-side semiconductor fin portion and a drain-side semiconductor fin portion. Next, and within the extended cavity, a faceted source structure is formed from an exposed sidewall of the source-side semiconductor fin portion and a faceted drain structure is formed from an exposed sidewall of the drain-side semiconductor fin portion. Contact openings are then in the planarized dielectric material, and thereafter the source-side semiconductor fin portion and the faceted source structure are removed to provide a first contact cavity, and the drain-side semiconductor fin portion and the faceted drain structure are removed to provide a second contact cavity. A first metal structure is then formed in the first contact cavity, the first metal structure having a faceted sidewall that is located in the extended cavity, and a second metal structure is formed in the second contact cavity, the second metal structure having a faceted sidewall that is located in the extended cavity, wherein the faceted sidewall of the second metal structure is spaced apart from the faceted sidewall of the first metal structure.

In another embodiment of the present application, the method may include forming a sacrificial gate structure straddling over a portion of a semiconductor fin. Next, a planarized dielectric material is formed having a topmost surface that is coplanar with a topmost surface of the sacrificial gate structure and on each side of the sacrificial gate structure. A first opening is formed in the planarized dielectric material and only one side of the sacrificial gate structure. Next, a portion of the semiconductor fin exposed by the first opening is removed to provide a first contact cavity. A dielectric structure is formed in the first contact cavity, and thereafter the sacrificial gate structure is removed to provide a cavity. The cavity is then extended entirely though the semiconductor fin to provide a semiconductor fin portion. A faceted structure is then formed in the extended cavity and from an exposed sidewall of the semiconductor fin portion. Next, a second contact opening is formed in the planarized dielectric material that exposes the semiconductor fin portion. The semiconductor fin portion and the faceted structure are then removed to provide a second contact cavity. Next, a metal structure is formed in the second contact cavity, the metal structure having a faceted sidewall that is located in the extended cavity.

DETAILED DESCRIPTION

Figure 1:
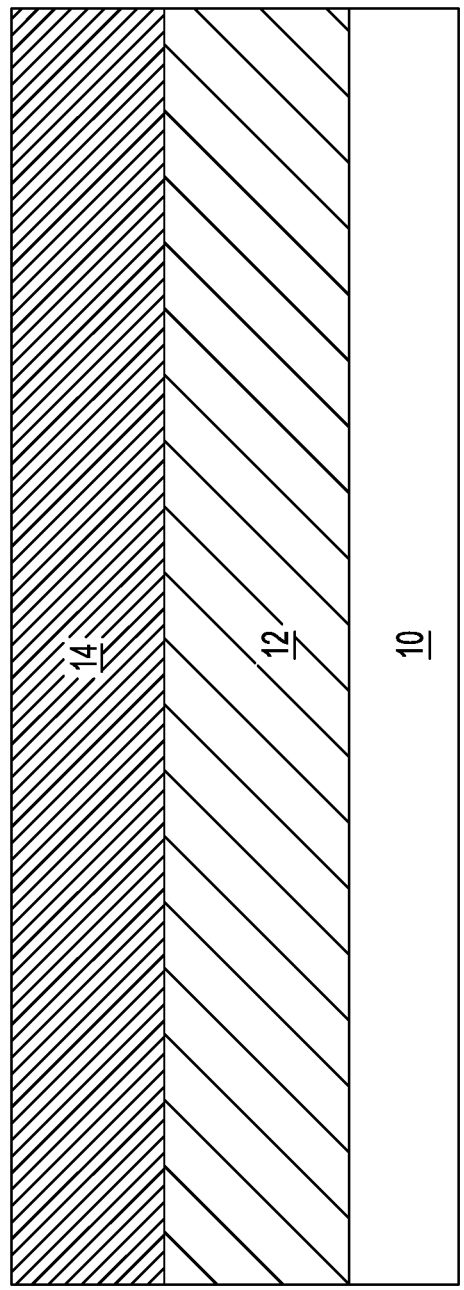
FIG. 1 is a cross sectional view of an exemplary semiconductor structure containing a semiconductor fin located on a surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure containing a semiconductor fin 14 located on a surface of a substrate. In the illustrated embodiment, the substrate includes, from bottom to top, a handle substrate 10 and an insulator layer 12. In another embodiment (not illustrated), the substrate may contain only the insulator layer 12. In yet another embodiment (not shown), the substrate may contain a remaining portion of a bulk semiconductor material. Although a single semiconductor fin 14 is described and illustrated, a plurality of semiconductor fins can be formed on the substrate in which each semiconductor fin of the plurality of semiconductor fins is orientated parallel to each other.

The structure shown in FIG. 1 can be formed by first providing an initial substrate. The initial substrate may be a bulk semiconductor substrate that is composed entirely of at least one semiconductor material; the bulk semiconductor substrate does not contain any dielectric and/or conductive materials. In such an embodiment, the substrate and the semiconductor fin 14 may be composed of a same, or different, semiconductor material. The semiconductor material that provides the bulk semiconductor substrate may include any material, or stack of materials, having semiconducting properties including, but not limited to, silicon (Si), germanium (Ge), silicon germanium (SiGe) alloys, III-V compound semiconductors, or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the initial substrate is a bulk semiconductor substrate that is composed entirely of silicon or a silicon germanium alloy.

The semiconductor material or materials that provide(s) the bulk semiconductor substrate may have any of the well known crystal orientations. For example, the crystal orientation of the bulk semiconductor structure may be {100}, {110}, or {111}. Other crystallographic orientations besides those specifically mentioned can also be used in the present application. At least an upper portion of the bulk semiconductor substrate which is processed into the semiconductor fin 14 is single crystalline.

In another embodiment, a semiconductor-on-insulator (SOI) substrate can be used as the initial substrate. The SOI substrate includes handle substrate 10, insulator layer 12 and a topmost semiconductor material layer. The topmost semiconductor material layer of the SOI substrate will be subsequently processed into the semiconductor fin 14 shown in FIG. 1. The initial substrate may also be composed of an insulator layer and a topmost semiconductor material layer.

In one embodiment, the handle substrate 10 may be composed of one of the semiconductor materials mentioned above. When the handle substrate 10 is composed of at least one semiconductor material, the at least one semiconductor material that provides the handle substrate 10 may be single crystalline, polycrystalline or amorphous. In one example, the handle substrate 10 is composed of single crystalline silicon or a single crystalline silicon germanium alloy. In other embodiments, the handle substrate 10 may be composed of a non-semiconductor material including, for example, a dielectric material and/or a conductive material.

The insulator layer 12 may be a crystalline or non-crystalline dielectric material such as an oxide and/or nitride. In one embodiment, the insulator layer 12 is a dielectric oxide such as, for example, silicon dioxide. In another embodiment of the present application, the insulator layer 12 may be a dielectric nitride such as, for example, silicon nitride or boron nitride. In yet another embodiment of the present application, the insulator layer 12 may include a stack of a dielectric oxide and a dielectric nitride. In one example, a stack of, in any order, silicon dioxide and silicon nitride or boron nitride may be employed as the insulator layer 12. The insulator layer 12 may have a thickness from 10 nm to 200 nm, although other thicknesses that are lesser than, or greater than, the aforementioned thickness range may also be employed as the thickness of the insulator layer 12.

The topmost semiconductor material layer of the SOI substrate includes one of the semiconductor materials mentioned above for the bulk semiconductor substrate. The semiconductor material that provides the topmost semiconductor material layer of the SOI may be a relaxed semiconductor material or a strained semiconductor material. In one embodiment, the semiconductor material that provides the topmost semiconductor material layer includes a same semiconductor material as the handle substrate 10. In one example, silicon is employed as the semiconductor material for both the handle substrate 10 and the topmost semiconductor material layer of the SOI substrate. In another embodiment, the topmost semiconductor material layer of the SOI substrate includes a semiconductor material that differs from a semiconductor material that provides the handle substrate 10. In one example, the handle substrate 10 may be composed of silicon, while the topmost semiconductor material layer may be composed of a silicon germanium alloy.

The topmost semiconductor material layer of the SOI substrate may have one of the crystal orientations mentioned above for the semiconductor material that provides the bulk semiconductor substrate. In one embodiment, the crystal orientation of the topmost semiconductor material layer of the SOI substrate is the same as the crystal orientation of the handle substrate 10. In another embodiment, the crystal orientation of the topmost semiconductor material layer of the SOI substrate differs from the crystal orientation of the handle substrate 10. Typically, the topmost semiconductor material layer of the SOI substrate is a single crystalline semiconductor material. The topmost semiconductor material layer of the SOI substrate may have a thickness from 10 nm to 100 nm, although other thicknesses that are lesser than, or greater than, the aforementioned thickness range may also be employed as the thickness of the topmost semiconductor material layer of the SOI substrate.

In one embodiment, the SOI substrate may be formed by wafer bonding. In yet another embodiment, the SOI substrate may be formed by an implantation process known as SIMOX (i.e., Separation by IMplanting OXygen). In some embodiments of the present application, a thermal mixing process or a thermal condensation process may be employed in forming the topmost semiconductor material layer of the SOI substrate. Thermal mixing includes annealing in an inert ambient (i.e., helium and/or argon), while thermal condensation includes annealing in an oxidizing ambient (air, oxygen, ozone and/or $NO_2$). The anneal temperature for both thermal mixing and thermal condensation can be from 600° C. to 1200° C. In such a process, a sacrificial silicon germanium alloy layer having a first germanium content can formed on a silicon layer that is located atop the insulator layer 12. One of thermal mixing or thermal condensation can then be performed to convert the Si/SiGe material stack into a silicon germanium alloy layer having a second germanium content that differs from the first germanium content. The silicon germanium alloy having the second germanium content can be used as the topmost semiconductor material layer of SOI substrate.

After providing the initial substrate (bulk or SOI), a patterning process is used to define the semiconductor fin 14. In one embodiment, the patterning process used to define the semiconductor fin 14 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In some embodiments, the etch stops on a topmost surface of the insulator layer 12. In other embodiments, the etch may stop within a remaining portion of a bulk semiconductor substrate.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In yet another embodiment, the patterning process may include a direct self-assembly (DSA) patterning process.

As used herein, a "fin" refers to a contiguous semiconductor material, and including a pair of vertical sidewalls that are parallel to each other. As used herein, a surface is "vertical" if there exists a vertical plane from which the surface does not deviate by more than three times the root mean square roughness of the surface. In one embodiment of the present application, the semiconductor fin 14 may have a width from 4 nm to 30 nm; the height of the semiconductor fin 14 may be from 10 nm to 150 nm. Other widths and heights that are lesser than, or greater than the ranges mentioned herein can also be used in the present application. Each semiconductor fin can be separated by a pitch of from 20 nm to 100 nm.

Figure 2:
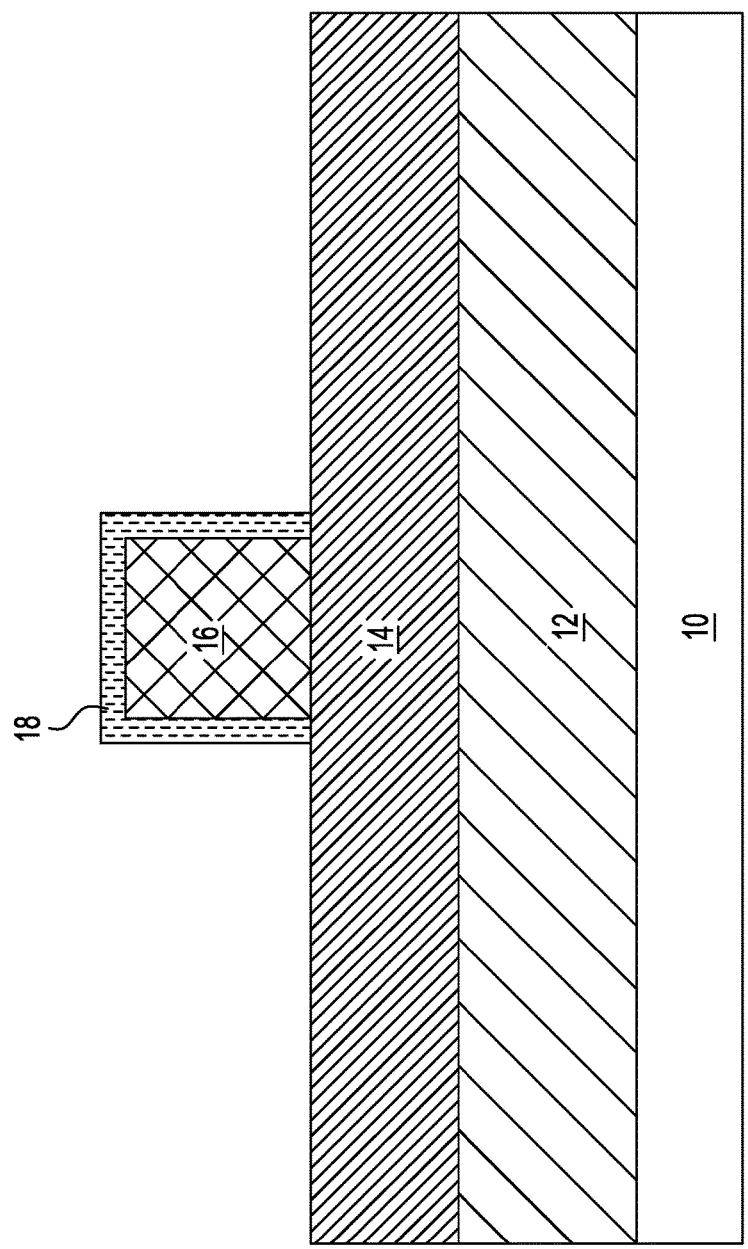
FIG. 2 is a cross sectional view of the exemplary semiconductor structure of FIG. 1 after forming a sacrificial gate structure straddling over a portion of the semiconductor fin and forming a dielectric spacer material surrounding the sacrificial gate structure.

Referring now to FIG. 2, there is illustrated the exemplary semiconductor structure of FIG. 1 after forming a sacrificial gate structure 16 straddling over a portion of the semiconductor fin 14 and forming a dielectric spacer material 18 surrounding the sacrificial gate structure 16. Although a single sacrificial gate structure 16 is described and illustrated, a plurality of sacrificial gate structures can be formed straddling over other portions of the semiconductor fin 14.

By "sacrificial gate structure" it is meant a material or material stack that serves as a placeholder for a subsequently formed structure such as, for example, a functional or non-functional gate structure. By "straddling over" it is meant that at least one portion of each gate sacrificial structure is located on one side of the semiconductor fin 14, while another portion of the same sacrificial gate structure is located on another side of the semiconductor fin 14. The two sacrificial gate portions are interconnected by a portion of the sacrificial gate structure that is located directly atop of the semiconductor fin 14.

Each sacrificial gate structure 16 may include a sacrificial gate dielectric portion (not individually shown), a sacrificial gate material portion (not individually shown) and a sacrificial gate cap portion (not individually shown). In some embodiments, each sacrificial gate dielectric portion and/or each sacrificial gate cap portion may be omitted. Each sacrificial gate dielectric portion may include an oxide, nitride, and/or oxynitride. In one example, each sacrificial gate dielectric portion may include silicon dioxide and/or silicon nitride. In another embodiment, each sacrificial gate dielectric portion may include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each sacrificial gate dielectric portion.

Each sacrificial gate material portion may include polysilicon, amorphous silicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Each sacrificial gate cap portion includes a hard mask material such as, for example, silicon dioxide, silicon nitride, and/or silicon oxynitride.

The sacrificial gate structure 16 can be formed by deposition of the various sacrificial material layers and then patterning the resultant sacrificial material sack by utilizing, for example, lithography and etching. The height of each sacrificial gate structure 16 may be from 50 nm to 200 nm, although other heights that are lesser than, or greater than, the aforementioned height range may be employed.

After forming the sacrificial gate structure 16, the dielectric spacer material 18 is formed surrounding the sacrificial gate structure 16. By "surrounding" it is meant that the dielectric spacer material 18 is present on all exposed surfaces (i.e., sidewall surfaces and topmost surface) of the sacrificial gate structure 16. The dielectric spacer material 18 may comprise any dielectric spacer material such as, for example, silicon dioxide, silicon nitride or a dielectric metal oxide. The dielectric spacer material 16 can be formed by a deposition process such as, for example, chemical vapor deposition (CVD), plasma enhanced chemical vapor deposition (PECVD), or atomic layer deposition (ALD). An etch such as, for example, reactive ion etching, may follow the deposition process.

Figure 3:
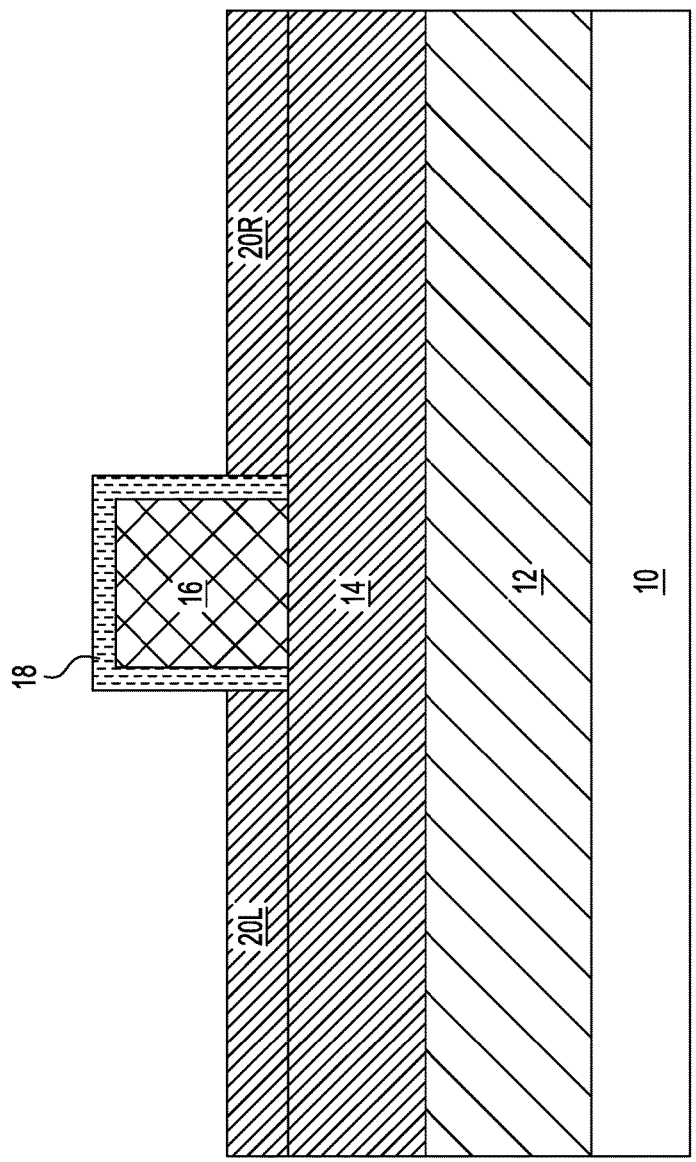
FIG. 3 is a cross sectional view of the exemplary semiconductor structure of FIG. 2 after forming a source-side semiconductor material on an exposed portion of the semiconductor fin and on one side of the sacrificial gate structure, and a drain-side semiconductor material on another exposed portion of the semiconductor fin and on another side of the sacrificial gate structure.

Referring now to FIG. 3, there is illustrated the exemplary semiconductor structure of FIG. 2 after forming a source-side semiconductor material 20L on an exposed portion of the semiconductor fin 14 and on one side of the sacrificial gate structure 16, and a drain-side semiconductor material 20R on another exposed portion of the semiconductor fin 16 and on another side of the sacrificial gate structure 16. In some embodiments of the present application, this step of the present application may be omitted.

When formed, each of the source-side semiconductor material 20L and the drain-side semiconductor material 20R has a topmost surface that is located beneath a topmost surface of the sacrificial gate structure 16. When formed, the source-side semiconductor material 20L has a sidewall surface that contacts a lower portion of the dielectric spacer material 18 that is located on one side of the sacrificial gate structure 16, while the drain-side semiconductor material 20R has a sidewall surface that contacts a lower portion of the dielectric spacer material 18 on the other side of the sacrificial gate structure 16.

Each of the source-side semiconductor material 20L and the drain-side semiconductor material 20R comprises a semiconductor material and either an n-type dopant or a p-type dopant. The semiconductor material that provides each of source-side semiconductor material 20L and the drain-side semiconductor material 20R typically comprises the same semiconductor material as the semiconductor fin 14. In one example, and when the semiconductor fin 14 is composed of silicon, each of the source-side semiconductor material 20L and the drain-side semiconductor material 20R is composed of silicon. In another example, and when the semiconductor fin 14 is composed of a silicon germanium alloy, each of the source-side semiconductor material 20L and the drain-side semiconductor material 20R is composed of a silicon germanium alloy.

The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. The term "p-type dopant" refers to an impurity that when added to an intrinsic semiconductor material creates to deficiencies of valance electrons. In a silicon containing semiconductor material, examples of p-type dopants include, but are not limited to, boron, aluminum, gallium and/or indium. In some embodiments of the present application, the concentration of dopants within the source-side semiconductor material 20L and the drain-side semiconductor material 20R can be in a range from $4 \times 10^{20}$ atoms/cm$^3$ to $2 \times 10^{21}$ atoms/cm$^3$; although other dopant concentrations that are lesser than, or greater than, the aforementioned range may also be employed in the present application.

Each of the source-side semiconductor material 20L and the drain-side semiconductor material 20R is formed utilizing an epitaxial growth process. The dopant can be added during the epitaxial growth process, or the dopant can be introduced after the epitaxial growth process utilizing one of ion implantation or gas phase doping. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing the source-side semiconductor material 20L and the drain-side semiconductor material 20R, the source-side semiconductor material 20L and the drain-side semiconductor material 20R have an epitaxial relationship with the exposed surface of the semiconductor fin 14.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the source-side semiconductor material 20L and the drain-side semiconductor material 20R can be performed utilizing any well known precursor gas or gas mixture. Carrier gases like hydrogen, nitrogen, helium and argon can be used. As mentioned above, a dopant source can be introduced into the precursor or precursor gas mixture during the epitaxial growth of the source-side semiconductor material 20L and the drain-side semiconductor material 20R.

In some embodiments, an anneal may be performed to drive dopants from the source-side semiconductor material 20L and the drain-side semiconductor material 20R into the underlying portions of the semiconductor fin 14. In such an embodiment, the anneal may be performed at a temperature from 800° C. to 1250° C. in an inert ambient.

Figure 4:
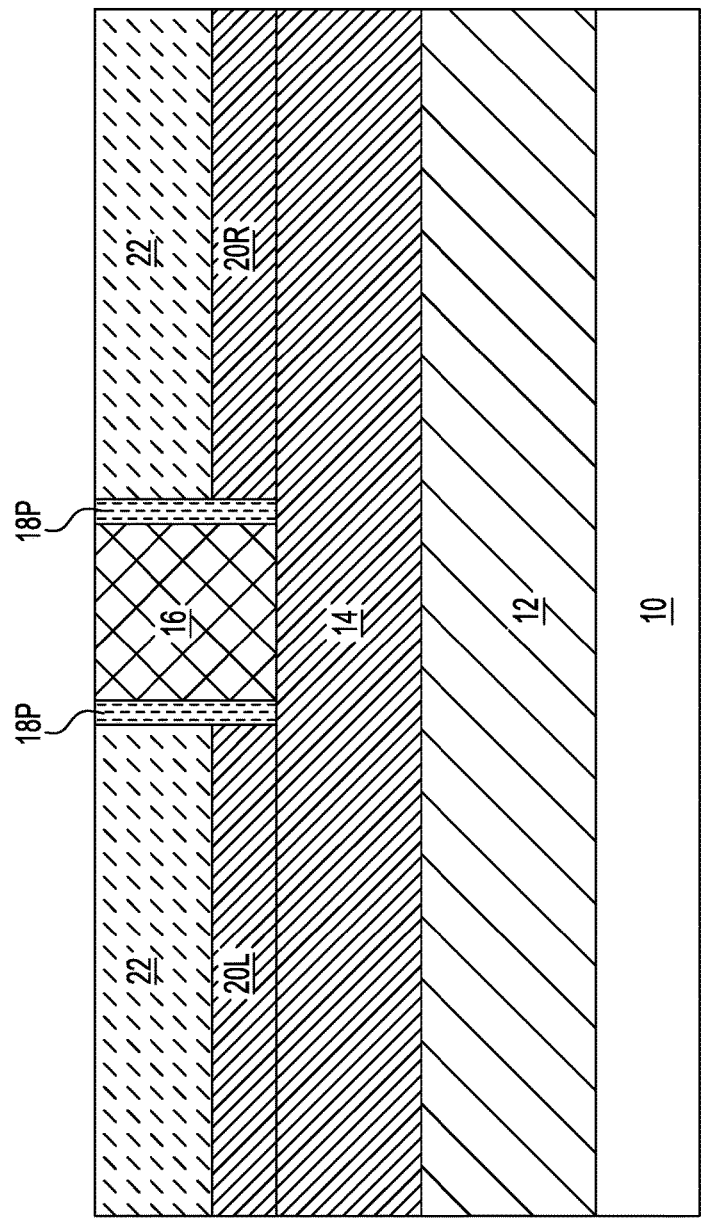
FIG. 4 is a cross sectional view of the exemplary semiconductor structure of FIG. 3 after forming a planarized dielectric material having a topmost surface that is coplanar with a topmost surface of the sacrificial gate structure and on each side of the sacrificial gate structure.

Referring now to FIG. 4, there is illustrated the exemplary semiconductor structure of FIG. 3 after forming a planarized dielectric material 22 having a topmost surface that is coplanar with a topmost surface of the sacrificial gate structure 16 and on each side of the sacrificial gate structure 16. During the forming of the planarized dielectric material 22, or after forming the planarized dielectric material 22, the dielectric spacer material 18 is removed from a topmost surface of the sacrificial gate structure 16 to form a dielectric spacer 18P along each sidewall of the sacrificial gate structure 16.

In the illustrated embodiment, a portion of the planarized dielectric material 22 is formed directly upon a topmost surface of the source-side semiconductor material 20L, while another portion of the planarized dielectric material 22 is formed directly upon a topmost surface of the drain-side semiconductor material 20R. When the source-side semiconductor material 20L and the drain-side semiconductor material 20R are not formed, the planarized dielectric material 22 will be formed upon a portion of the semiconductor fin 14 not including the sacrificial gate structure 16 and the dielectric spacer 18P.

The planarized dielectric material 22 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarized dielectric material 22. The use of a self-planarizing dielectric material as the planarized dielectric material 22 may avoid the need to perform a subsequent planarizing step.

In one embodiment, the planarized dielectric material 22 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the planarized dielectric material 22, a planarization process or an etch back process follows the deposition of the dielectric material that provides the planarized dielectric material 22. During this planarization process, the dielectric spacer material 18 is removed from a topmost surface of the sacrificial gate structure 16 to form a dielectric spacer 18P along each sidewall of the sacrificial gate structure 16. In another embodiment, and when a self-planarizing dielectric material is employed as the planarized dielectric material 22, a separate planarization process may follow the deposition of the self-planarizing dielectric material so as to remove the dielectric spacer material 18 from a topmost surface of the sacrificial gate structure 16 and to form a dielectric spacer 18P along each sidewall of the sacrificial gate structure 16.

Figure 5:
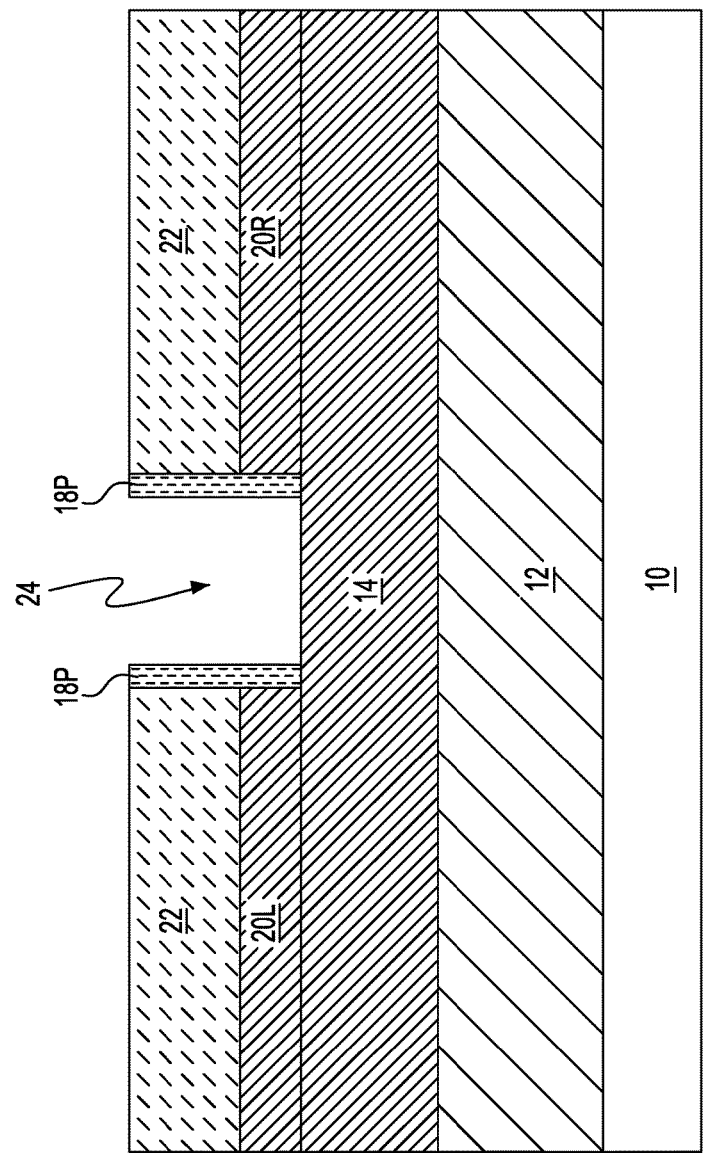
FIG. 5 is a cross sectional view of the exemplary semiconductor structure of FIG. 4 after removing the sacrificial gate structure to provide a cavity.

Referring now to FIG. 5, there is illustrated the exemplary semiconductor structure of FIG. 4 after removing the sacrificial gate structure 16 to provide a cavity 24. The cavity 24, which exposes a portion of the semiconductor fin 14, can be formed utilizing an anisotropic etch that is selective in removing the material or materials that provide the sacrificial gate structure 16. A single anisotropic etch or multiple anisotropic etches may be employed. Typically, the anisotropic etch employed to form the cavity 24 is a reactive ion etch. The area of the cavity 24 is bounded by the exposed portion of the topmost surface of the semiconductor fin 14 and the sidewall surfaces of the dielectric spacer 18P that were previously present alone each sidewall of the sacrificial gate structure 16.

Figure 6:
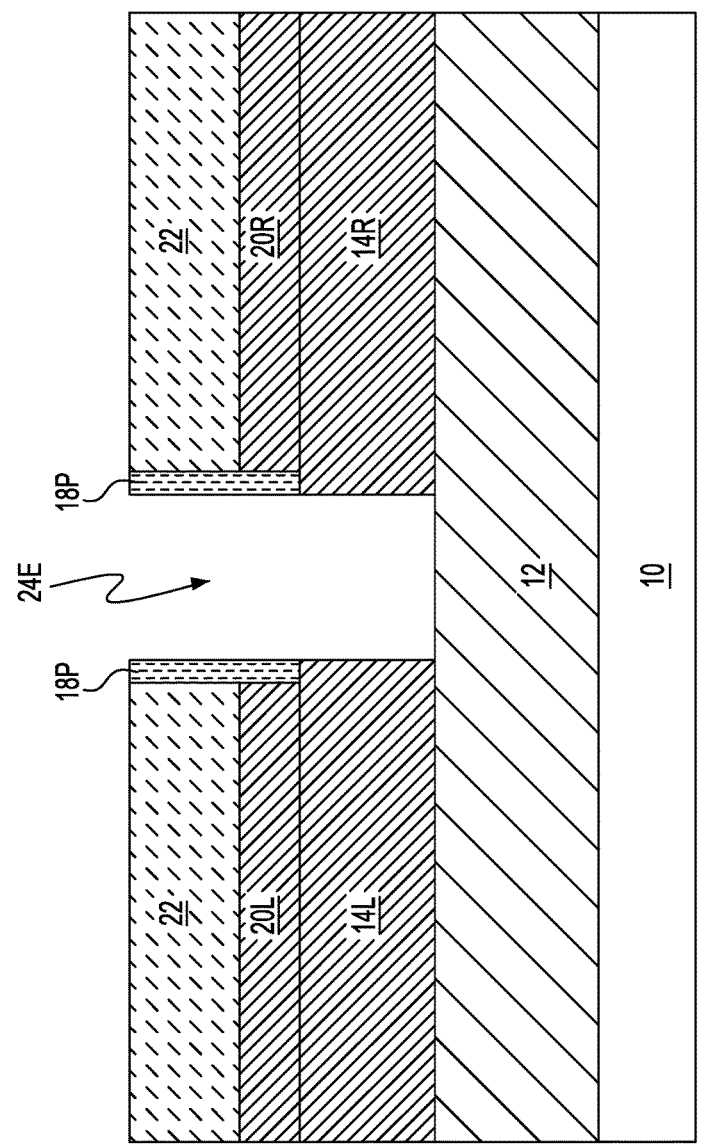
FIG. 6 is a cross sectional view of the exemplary semiconductor structure of FIG. 5 after extending said cavity by removing exposed portions of the semiconductor fin to provide a source-side semiconductor fin portion and a drain-side semiconductor fin portion.

Referring now to FIG. 6, there is illustrated the exemplary semiconductor structure of FIG. 5 after extending the cavity 24 by removing exposed portions of the semiconductor fin 14 to provide a source-side semiconductor fin portion 14L and a drain-side semiconductor fin portion 14R. Element 24E denotes an extended cavity that is formed in this step of the present application.

In the illustrated embodiment, the extended cavity 24E is performed utilizing another anisotropic etch that is selective in removing the exposed portion of the semiconductor fin 14. The extended cavity 24E has a bottommost surface that is located at, or beneath, the bottommost surface of the semiconductor fin 14. FIG. 6 illustrates an embodiment in which the extended cavity 24E has a bottommost surface that is located within a portion of the insulator layer 12.

Figure 7:
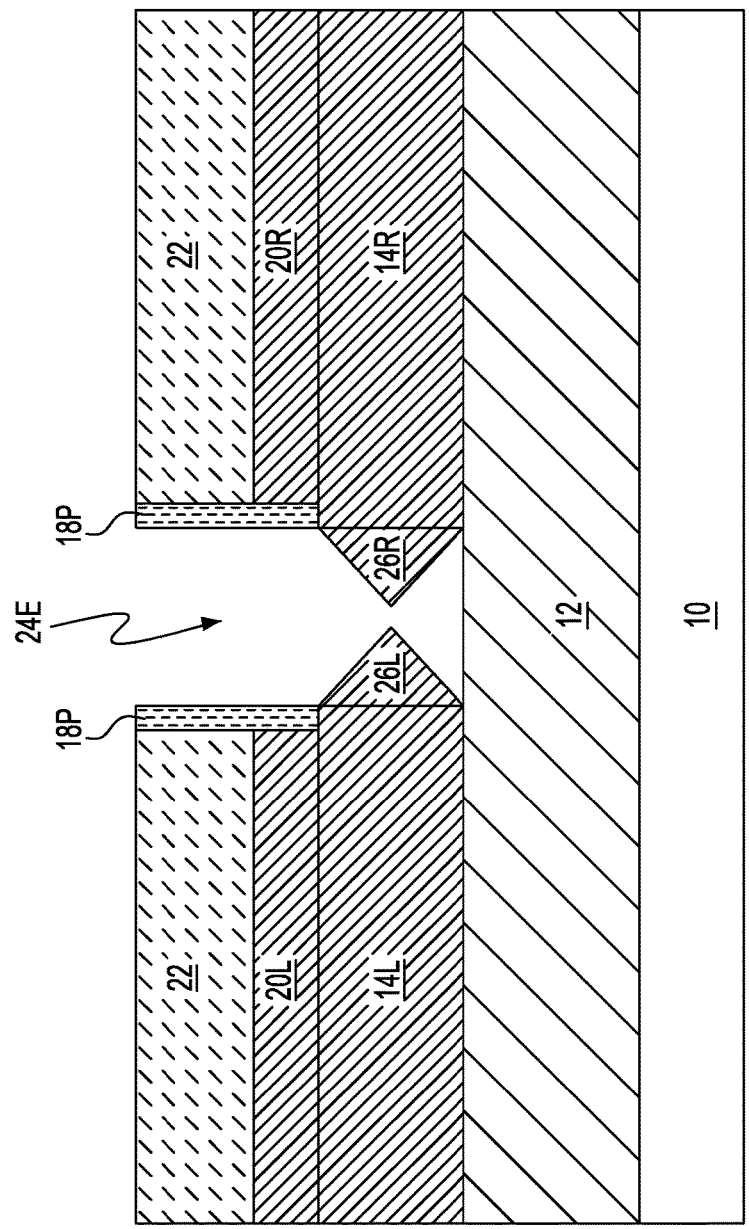
FIG. 7 is a cross sectional view of the exemplary semiconductor structure of FIG. 6 after epitaxially growing a faceted source structure from an exposed sidewall of the source-side semiconductor fin portion and a faceted drain structure from an exposed sidewall of the drain-side semiconductor fin portion.

Referring now to FIG. 7, there is illustrated the exemplary semiconductor structure of FIG. 6 after epitaxially growing a faceted source structure 26L from an exposed sidewall of the source-side semiconductor fin portion 14L, and a faceted drain structure 26R from an exposed sidewall of the drain-side semiconductor fin portion 14R.

Each of the faceted source structure 26L and the faceted drain structure 26R has one sidewall surface that has a sharp corner and thus this sidewall of the faceted structures is not perpendicular with the horizontal surface of the underlying substrate. In one embodiment, and as is illustrated, each faceted source structure 26L and the faceted drain structure 26R is triangular in shape with the base of the triangle located on a respective sidewall surface of one of the semiconductor fin portions (i.e., 14L and 14R), and the point of the triangle extending outward and into the extended cavity 24E. In some embodiments, the faceted source structure 26L is bounded by (111) planes to the sidewall of the source-side semiconductor fin portion 14L, while the faceted drain structure 26R is bounded by (111) planes to the sidewall of the drain-side semiconductor fin portion 14R.

In accordance with the present application, the faceted source structure 26L and the faceted drain structure 26R are spaced apart from each other by a gap. Thus, the faceted source structure 26L and the faceted drain structure 26R are not in intimate contact with each other.

The faceted source structure 26L and the faceted drain structure 26R include the same semiconductor material as the semiconductor fin 14 and thus the source-side semiconductor fin portion 14L and the drain-side semiconductor fin portion 14R. The faceted source structure 26L and the faceted drain structure 26R may be doped with an n-type or p-type dopant as mentioned above. The faceted source structure 26L and the faceted drain structure 26R can be formed utilizing a selective epitaxial growth process in which growth of the semiconductor material occurs only from exposed surfaces of another semiconductor material. The selective epitaxial growth that can be used to provide the faceted source structure 26L and the faceted drain structure 26R may include the same epitaxial growth process apparatuses, precursor gases, carrier gases, and temperatures as mentioned above in forming the source-side semiconductor material 20L and the drain-side semiconductor material 20R.

Figure 8:
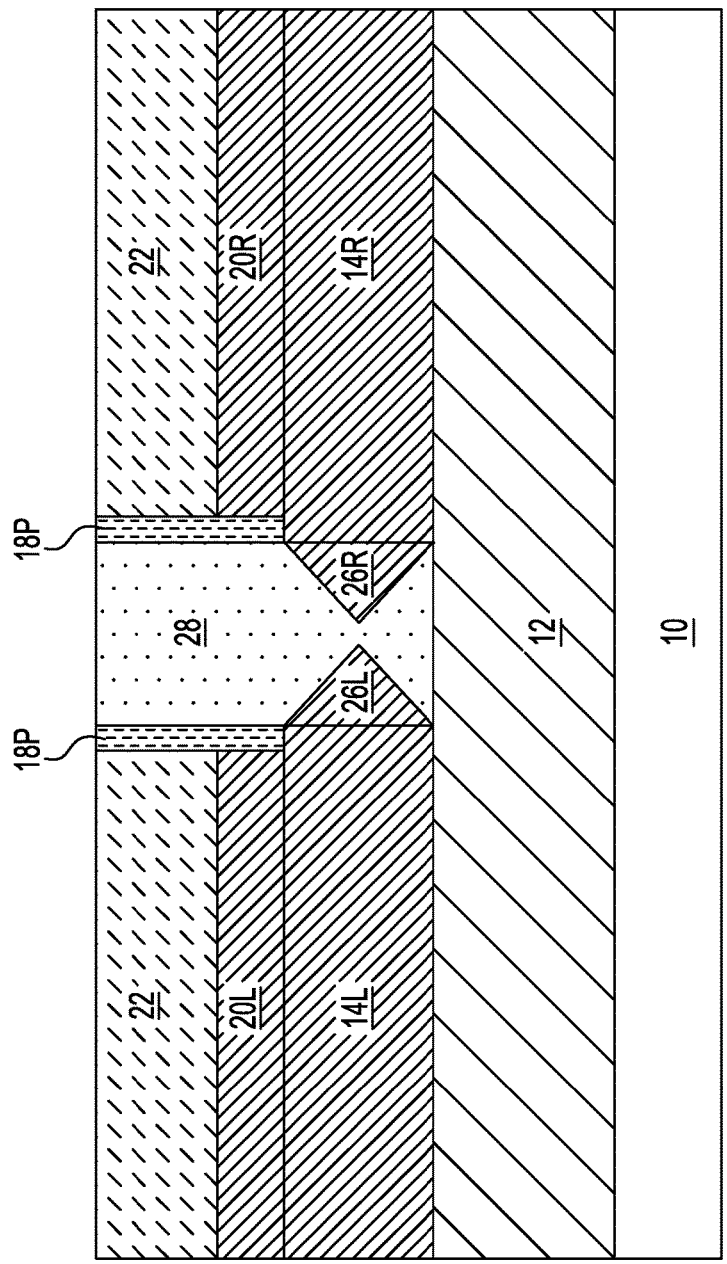
FIG. 8 is a cross sectional view of the exemplary semiconductor structure of FIG. 7 after forming a dielectric structure in a remaining portion of the extended cavity.

Referring now to FIG. 8, there is illustrated the exemplary semiconductor structure of FIG. 7 after forming a dielectric structure 28 in a remaining portion of the extended cavity 24E. As is shown, the dielectric structure 28 has an hour glass shape including a lower portion, a middle portion and an upper portion, wherein the middle portion has a width that is less than a width of either the lower portion or the upper portion of the dielectric structure 28.

The dielectric structure 28 may be formed by depositing a dielectric material at least within the extended opening 24E utilizing a conventional deposition process. The dielectric material that provides the dielectric structure 28 may be the same as, or different from, the dielectric material that provides the planarized dielectric material 22. In some embodiments, the dielectric material that provides the dielectric structure 28 may be composed of an oxide such as, for example, silicon dioxide. In some embodiments, and after depositing the dielectric material, a planarization process such as, for example, chemical mechanical polishing (CMP), may be performed.

Figure 9:
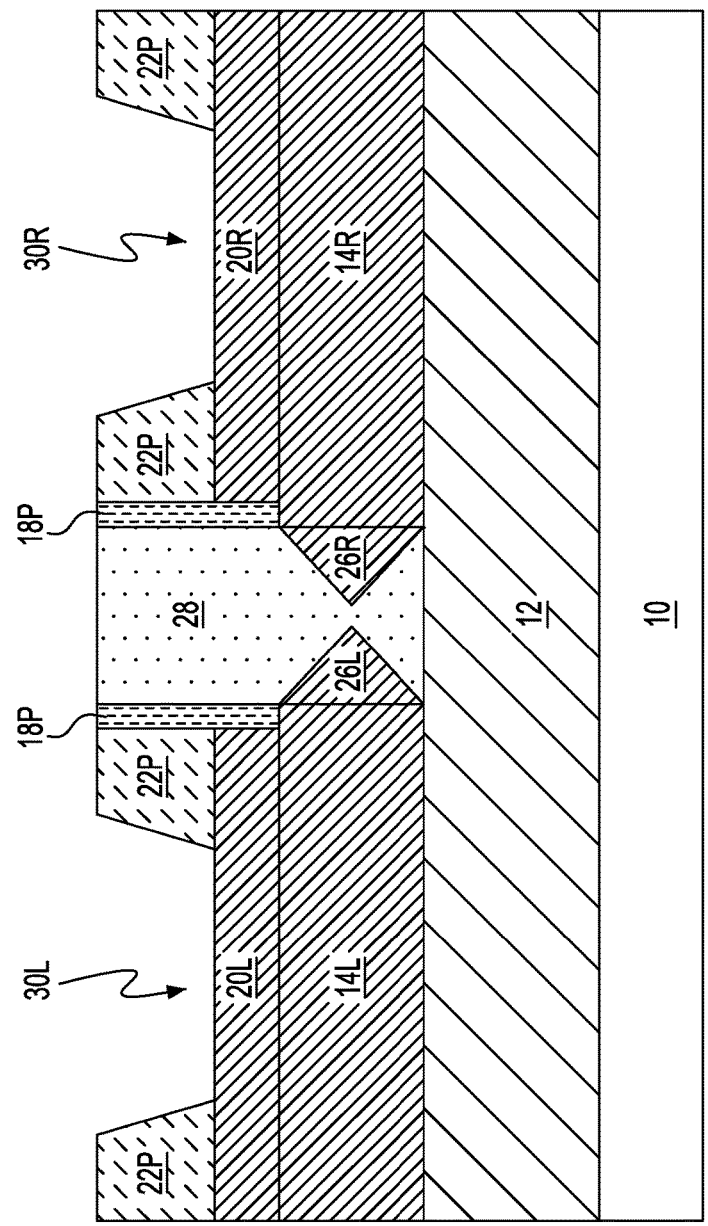
FIG. 9 is a cross sectional view of the exemplary semiconductor structure of FIG. 8 after forming contact openings in the planarized dielectric material.

Referring now to FIG. 9, there is illustrated the exemplary semiconductor structure of FIG. 8 after forming contact openings (30L, 30R) in the planarized dielectric material 22. Element 30L may be referred to as a first (i.e., source) contact opening, while element 30R may be referred to as a second (i.e., drain) contact opening. Contact openings (30L, 30R) can be formed by lithography and etching, as defined above in forming the semiconductor fin 14. In FIG. 9, element 22P denotes a remaining portion of the planarized dielectric material 22 (hereafter each remaining portion of the planarized dielectric material 22 is referred to as planarized dielectric material portion 22P).

The contact openings (30L, 30R) can have slanted sidewalls, as shown, or in other embodiments, the sidewalls of the contact openings (30L, 30R) may be vertical. In some embodiments, and as shown, the first contact opening 30L exposes a portion of the topmost surface of the source-side semiconductor material 20L, while the second contact opening 30R exposes a portion of the topmost surface of the drain-side semiconductor material 20R. In embodiments in which the source-side semiconductor material 20L and the drain-side semiconductor material 20R are not present, the first contact opening 30L exposes a portion of the topmost surface of the source-side semiconductor fin portion 14L, while the second contact opening 30R exposes a portion of a topmost surface of the drain-side semiconductor fin portion 14R.

Figure 10:
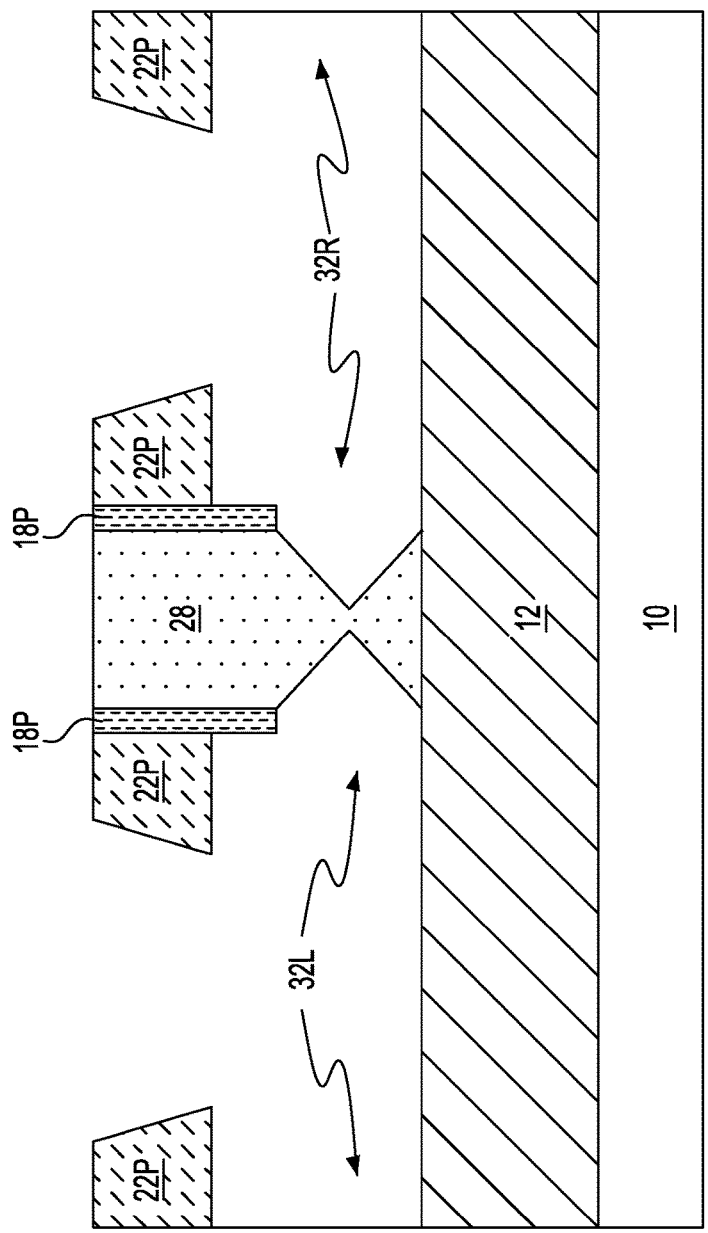
FIG. 10 is a cross sectional view of the exemplary semiconductor structure of FIG. 9 after removing the source-side semiconductor material, the source-side semiconductor fin portion and the faceted source structure to provide a first contact cavity, and the drain-side semiconductor material, the drain-side semiconductor fin portion, and the faceted drain structure to provide a second contact cavity.

Referring now to FIG. 10, there is illustrated the exemplary semiconductor structure of FIG. 9 after removing the source-side semiconductor material 20L, the source-side semiconductor fin portion 14L and the faceted source structure 26L to provide a first contact cavity 32L, and the drain-side semiconductor material 20R, the drain-side semiconductor fin portion 14R, and the faceted drain structure 26R to provide a second contact cavity 32R. The removal of the source-side semiconductor material 20L, the source-side semiconductor fin portion 14L and the faceted source structure 26L to provide the first contact cavity 32L, and the removal of the drain-side semiconductor material 20R, the drain-side semiconductor fin portion 14R, and the faceted drain structure 26R to provide the second contact cavity 32R may be performed utilizing an etch that is selective in removing the source-side semiconductor material 20L, the source-side semiconductor fin portion 14L, the faceted source structure 26L, the drain-side semiconductor material 20R, the drain-side semiconductor fin portion 14R, and the faceted drain structure 26R. The etch is performed through the respective contacting opening mentioned above. In one embodiment HCl gas may be used to provide the first and second contact cavities 32L, 32R. In another embodiment, a wet etchant such as, for example, tetramethylammonium hydroxide or ammonia can be used to provide the first and second contact cavities 32L, 32R. The first and second contact cavities 32L, 32R have at least one sidewall that is faceted.

Figure 11:
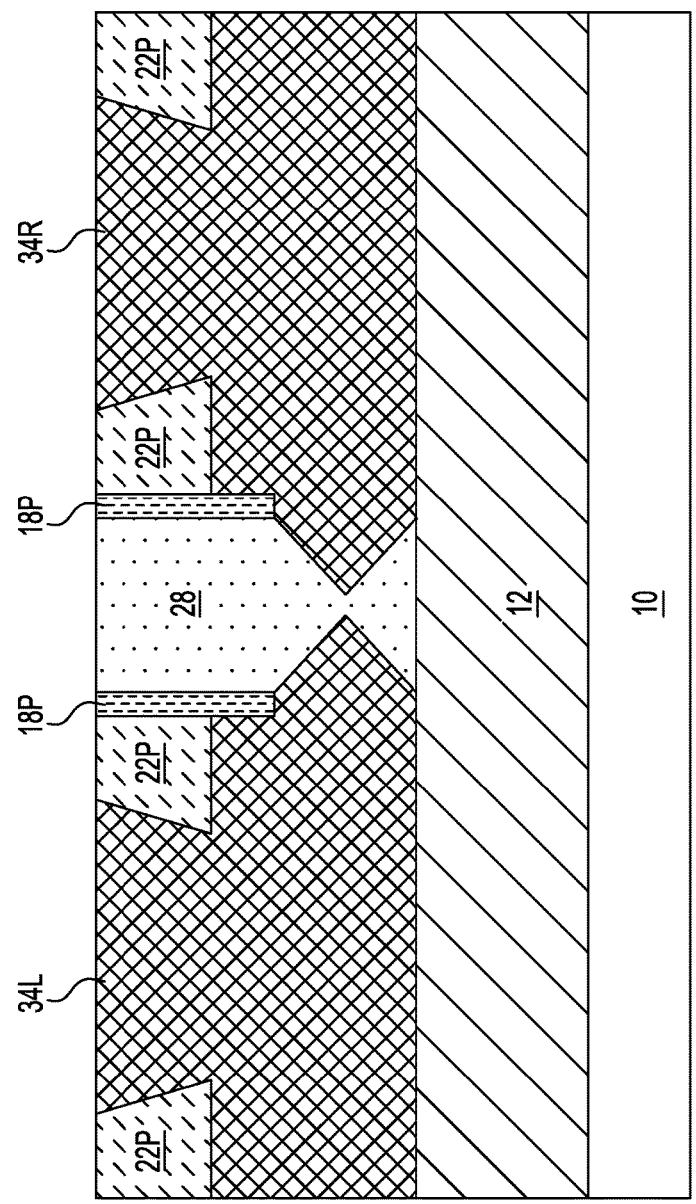
FIG. 11 is a cross sectional view of the exemplary semiconductor structure of FIG. 10 after forming a first metal structure in the first contact cavity and a second metal structure in the second contact cavity.

Referring now to FIG. 11, there is illustrated the exemplary semiconductor structure of FIG. 10 after forming a first metal structure 34L in the first contact cavity 32L and a second metal structure 34R in the second contact cavity 32R. In the illustrated embodiment, the first metal structure 34L, and the second metal structure 34R have one faceted sidewall that is formed in the extended opening 24E and is separated by a middle portion of the dielectric structure 28. The first metal structure 34L provides a first electrode of the anti-fuse of the present application, while the second metal structure 34R provides a second electrode of the anti-fuse of the present application. As is shown, a topmost surface of the first metal structure 34L is coplanar with a topmost surface of the each remaining portion of the planarized dielectric material portion 22P, and a topmost surface of the second metal structure 34R is coplanar with a topmost surface of the each remaining portion of the planarized dielectric material portion 22P. Dielectric spacers 18P, which line upper sidewalls of the dielectric structure 28, also have topmost surfaces that are coplanar with a topmost surface of each of the planarized dielectric material portion 22P, the first metal structure 34L, the dielectric structure 28, and the second metal structure 34R.

Each of the first metal structure 34L and the second metal structure 34R may include an elemental metal or metal alloy. In some embodiments, the first metal structure 34L and the second metal structure 34R may comprise aluminum (Al), copper (Cu), titanium (Ti), tungsten (W), cobalt (Co) or alloys thereof such as, for example, TiAl, or CuAl. The first metal structure 34L and the second metal structure 34R may be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. A planarization process such as, for example, CMP, may follow the deposition process.

Figure 12:
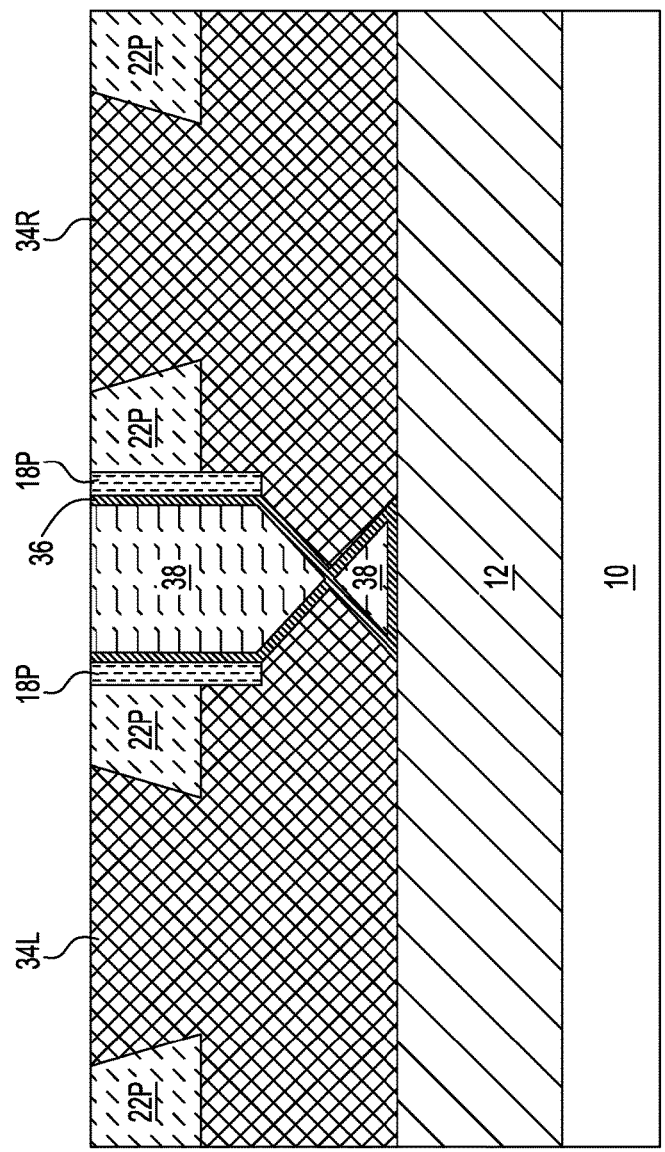
FIG. 12 is a cross sectional view illustrating another exemplary semiconductor structure of the present application.

Referring now to FIG. 12, there is illustrated another exemplary semiconductor structure of the present application. The exemplary semiconductor structure of this embodiment of the present application can be formed utilizing the processing steps mentioned above for providing the exemplary semiconductor structure shown in FIG. 11 except that the dielectric structure 28 formation is replaced with the formation of a gate structure (36, 38) that is non-functional. The gate structure includes a gate dielectric material portion 36 and a gate conductor portion 38. In this embodiment, the gate dielectric material portion 38 is present on the faceted sidewalls of the first and second metal structures 34L, 34R such that the gate dielectric material portion is merged (i.e., in contact with each other). In this embodiment, the gate conductor portion 38 includes a lower portion and an upper portion; these two portions are not individually labeled in the drawings.

The gate dielectric material portion 36 is composed of a gate dielectric material such as, for example, an oxide, nitride, and/or oxynitride. In one example, the gate dielectric material that provides the gate dielectric material portion 36 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the gate dielectric material portion 36.

The gate dielectric material used in providing the gate dielectric material portion 36 can be formed by any deposition process including, for example, chemical vapor deposition (CVD), plasma enhanced chemical vapor deposition (PECVD), physical vapor deposition (PVD), sputtering, or atomic layer deposition.

The gate conductor portion 38 comprises a gate conductor material. The gate conductor material used in providing gate conductor portion 38 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof.

The gate conductor portion 38 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

Figure 13:
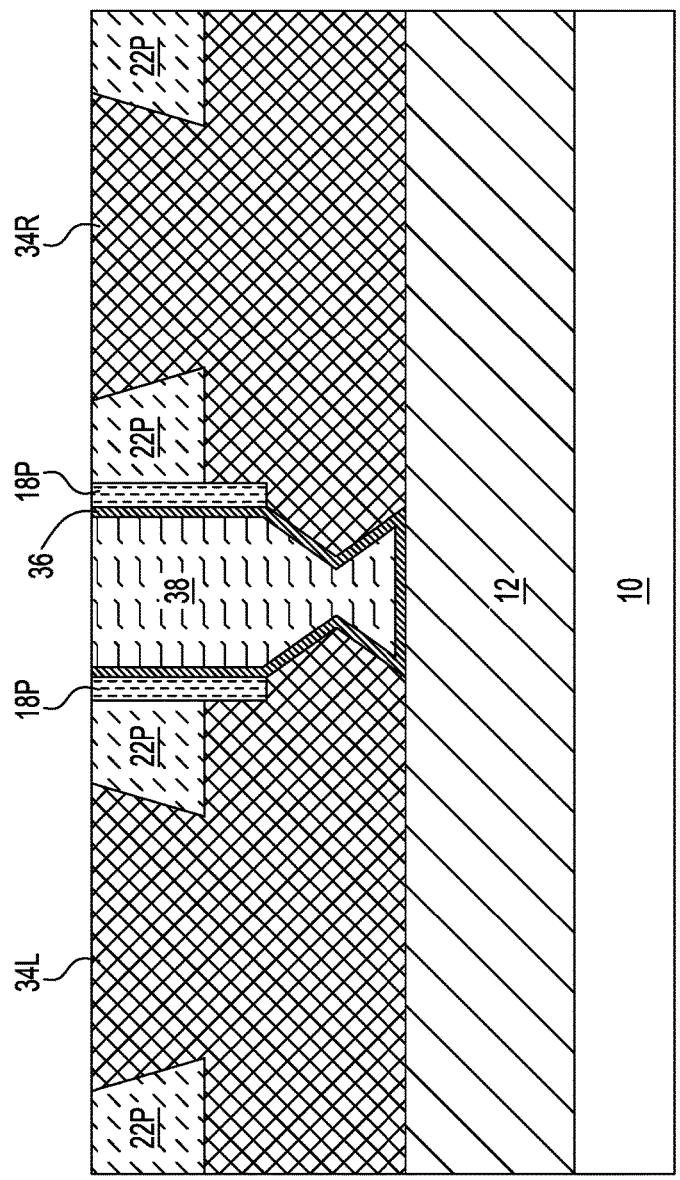
FIG. 13 is a cross sectional view illustrating a yet other exemplary semiconductor structure of the present application.

Referring now to FIG. 13, there is illustrated a yet other exemplary semiconductor structure of the present application. The exemplary semiconductor structure of this embodiment of the present application can be formed utilizing the processing steps mentioned above for providing the exemplary semiconductor structure shown in FIG. 11 except that the dielectric structure 28 formation is replaced with the formation of a gate structure (36, 38) that is functional. A functional gate structure is a permanent gate structure used to control output current (i.e., flow of carries in a channel) of a semiconductor device through electrical or magnetic fields. The gate structure includes a gate dielectric material portion 36 and a gate conductor portion 38, as defined above. In this embodiment, the gate dielectric material portion 38 is present on the faceted sidewalls of the first and second metal structures 34L, 34R however no merging of the gate dielectric material occurs.

Figure 14:
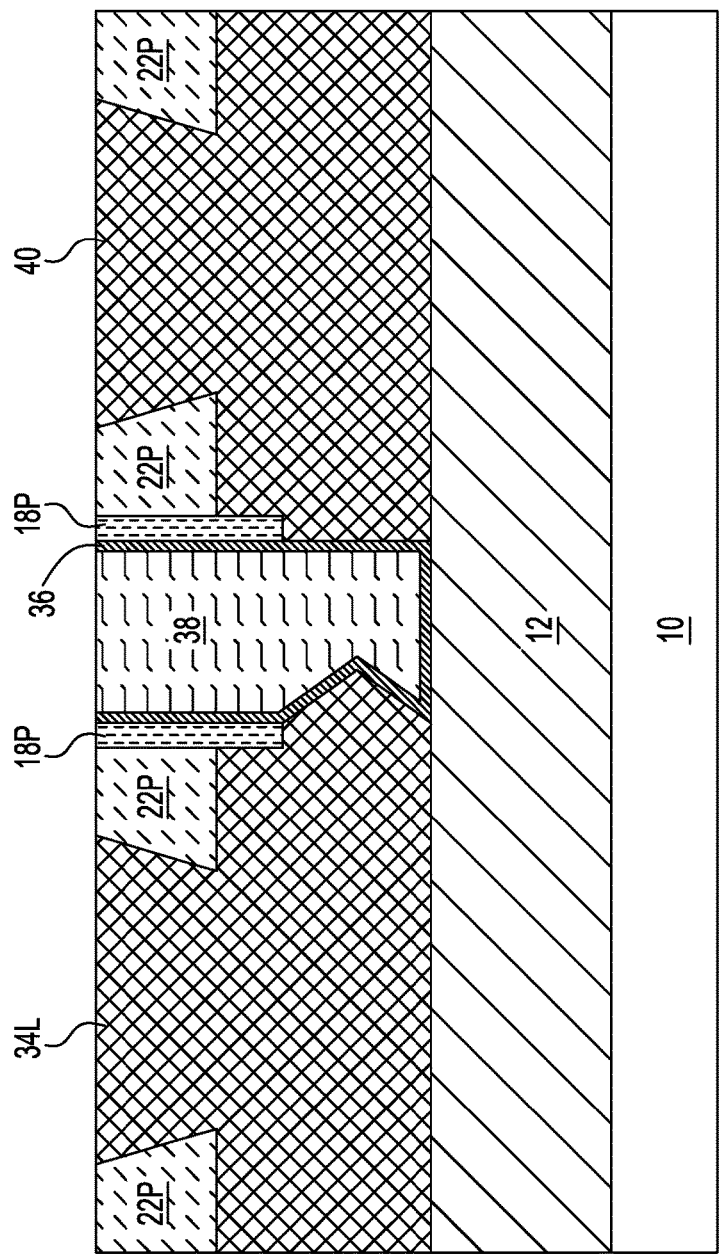
FIG. 14 is a cross sectional view illustrating a further exemplary semiconductor structure of the present application.

Referring now to FIG. 14, there is illustrated a further exemplary semiconductor structure of the present application. The exemplary semiconductor structure of this embodiment of the present application can be formed by first providing the exemplary semiconductor structure shown in FIG. 4. Next, and after forming a block mask over the source-side and the sacrificial gate structure 16, contact opening 30R can be formed in the planarized dielectric material 22 on the drain side of the sacrificial gate structure. The drain-side semiconductor material 20R and the drain semiconductor fin portion 14R are then removed forming the second contact cavity 30R. Thereafter, a dielectric structure 40 is formed within the second contact cavity 30R. The dielectric structure 40 may include one of the dielectric materials mentioned above for the dielectric structure 28. The dielectric structure 40 may be formed utilizing the technique mentioned above for forming the dielectric structure 28. After forming the dielectric structure 40, the block mask is removed, and the process as described above in FIGS. 5-11 is followed except the dielectric structure 28 formation is replaced with the formation of a gate structure (26, 28) that is functional. In this embodiment, the metal structure 34L formed on the source side has the faceted sidewalls. Although the drain side is processed to include the dielectric structure 40, it is within the scope of the present application to form the dielectric structure 40 on the source side and the faceted metal structure on the drain side.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a gate structure located on a substrate;
an anti-fuse located on said substrate and on a first side of said gate structure, said anti-fuse comprising a metal structure having a faceted sidewall that is present along a lower portion of said first side of said gate structure; and
a dielectric structure located on said substrate and on a second side of said gate structure, wherein second side of said gate structure is opposite said first side of said gate structure.

2. The semiconductor structure of claim 1, wherein said dielectric structure, said metal structure and said gate structure have topmost surfaces that are coplanar with each other.

3. The semiconductor structure of claim 2, wherein said dielectric structure, said metal structure and said gate structure have bottommost surfaces that are coplanar with each other.

4. The semiconductor structure of claim 1, further comprising a dielectric spacer located along an upper portion of said first and second sides of said gate structure.

5. A semiconductor structure comprising:
an anti-fuse located on a substrate, said anti-fuse comprising at first metal structure having a faceted sidewall and located on a first portion of the substrate, and a second metal structure having a faceted sidewall located on another portion of said substrate.

6. The semiconductor structure of claim 5, wherein said faceted sidewall of said first metal structure is spaced apart from said faceted sidewall of said second metal structure.

7. The semiconductor structure of claim 6, wherein a dielectric structure is present between said first metal structure and said second metal structure, said dielectric structure comprising an upper portion, a middle portion, and a lower portion, wherein said middle portion of said dielectric structure is located between said faceted sidewall of said first metal structure and said faceted sidewall of said second metal structure.

8. The semiconductor structure of claim 7, further comprising a dielectric spacer located on sidewall surfaces of said upper portion of said dielectric structure.

9. The semiconductor structure of claim 8, further comprising planarized dielectric material portions having a topmost surface that is coplanar with a topmost surface of each of said dielectric spacers, said upper portion of said dielectric structure, said first metal structure, and said second metal structure.

10. The semiconductor structure of claim 6, wherein a gate structure is present between said first metal structure and said second metal structure, said gate structure comprising a gate dielectric material portion and a gate conductor portion.

11. The semiconductor structure of claim 10, wherein said gate dielectric material portion is located on said faceted sidewall of said first metal structure and said faceted sidewall of said second metal structure, and wherein said gate dielectric material portion located on said faceted sidewall of said first metal structure is spaced apart from said gate dielectric material portion located on said faceted sidewall of said second metal structure.

12. The semiconductor structure of claim 10, wherein said gate dielectric material portion is located on said faceted sidewall of said first metal structure and said faceted sidewall of said second metal structure, and wherein said gate dielectric material portion located on said faceted sidewall of said first metal structure is in direct physical contact with said gate dielectric material portion located on said faceted sidewall of said second metal structure.

* * * * *